United States Patent [19]
McKee et al.

[11] Patent Number: 6,023,082
[45] Date of Patent: *Feb. 8, 2000

[54] STRAIN-BASED CONTROL OF CRYSTAL ANISOTROPY FOR PEROVSKITE OXIDES ON SEMICONDUCTOR-BASED MATERIAL

[75] Inventors: Rodney Allen McKee, Kingston; Frederick Joseph Walker, Oak Ridge, both of Tenn.

[73] Assignee: Lockheed Martin Energy Research Corporation, Oak Ridge, Tenn.

[*] Notice: This patent is subject to a terminal disclaimer.

[21] Appl. No.: 09/126,526

[22] Filed: Jul. 30, 1998

Related U.S. Application Data

[63] Continuation-in-part of application No. 08/692,343, Aug. 5, 1996, Pat. No. 5,830,270, and application No. 08/868,076, Jun. 3, 1997.

[51] Int. Cl.[7] ............................. H01L 29/78; H01L 29/04
[52] U.S. Cl. ........................................... 257/295; 257/627
[58] Field of Search ....................................... 257/295, 627

[56] References Cited

U.S. PATENT DOCUMENTS

| | | |
|---|---|---|
| 5,225,031 | 7/1993 | McKee et al. . |
| 5,323,023 | 6/1994 | Fork ........................................ 257/295 |
| 5,450,812 | 9/1995 | McKee et al. . |
| 5,567,979 | 10/1996 | Nashimoto ............................. 257/295 |
| 5,650,646 | 7/1997 | Summerfelt ............................. 257/295 |

*Primary Examiner*—Jerome Jackson, Jr.
*Attorney, Agent, or Firm*—Michael E. McKee; George L. Craig; Joseph A. Marasco

[57] ABSTRACT

A crystalline structure and a semiconductor device includes a substrate of a semiconductor-based material and a thin film of an anisotropic crystalline material epitaxially arranged upon the surface of the substrate so that the thin film couples to the underlying substrate and so that the geometries of substantially all of the unit cells of the thin film are arranged in a predisposed orientation relative to the substrate surface. The predisposition of the geometries of the unit cells of the thin film is responsible for a predisposed orientation of a directional-dependent quality, such as the dipole moment, of the unit cells. The predisposed orientation of the unit cell geometries are influenced by either a stressed or strained condition of the lattice at the interface between the thin film material and the substrate surface.

21 Claims, 3 Drawing Sheets

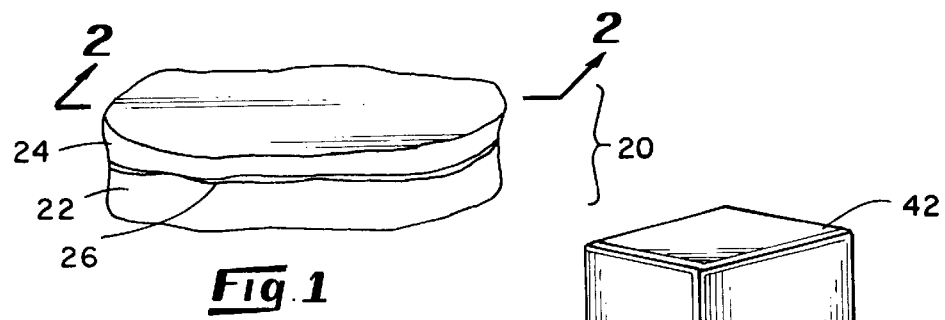
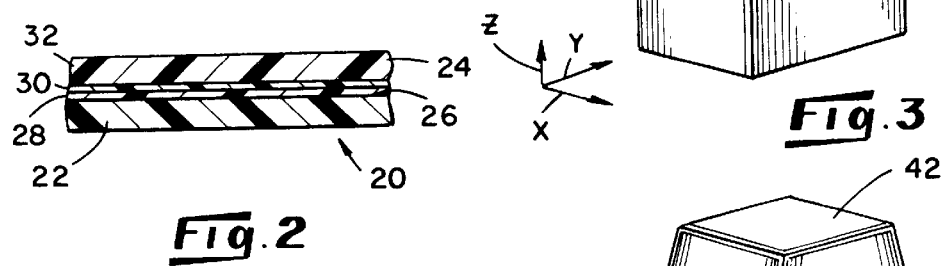
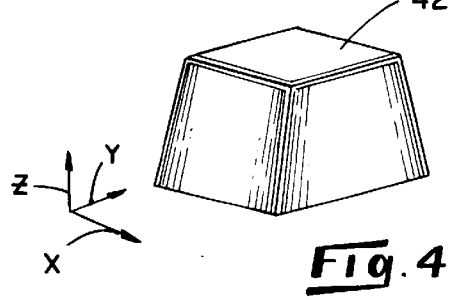
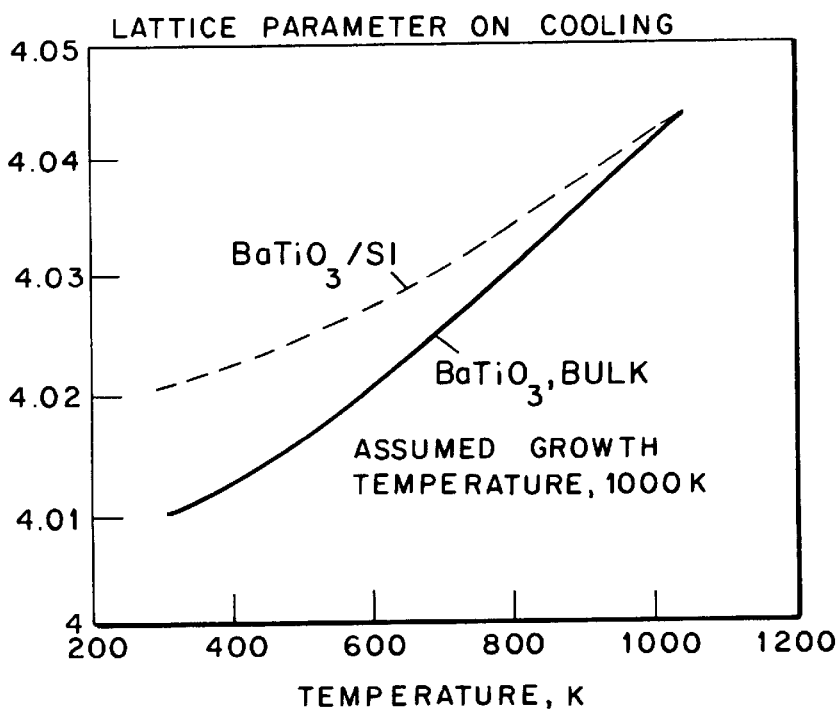

STRAIN-BASED CONTROL OF CRYSTAL ANISOTROPY FOR PEROVSKITE OXIDES ON SEMICONDUCTOR-BASED MATERIAL

BACKGROUND OF THE INVENTION

This invention is a continuation-in-part application of application Ser. No. 08/692,343, filed Aug. 5, 1996 now U.S. Pat. 5,830,270, the disclosure of which is incorporated herein by reference and of application Ser. No. 08/868,076, filed Jun. 3, 1997, the disclosure of which is incorporated herein by reference.

This invention was made with Government support under Contract No. DE-AC05-96OR22464 awarded by the U.S. Department of Energy to Lockheed Martin Energy Research Corporation, and the Government has certain rights in the invention.

This invention relates generally to structures and the preparation of such structures for use in semiconductor and related applications and relates, more particularly, to the growth of epitaxial thin-films upon semiconductor-based materials in the Group III–V, IV and II–VI classes such as, by way of example and not limitation, silicon, germanium or silicon-germanium alloys so that the thin films grown thereon possess desirable properties.

In our co-pending application Ser. No. 08/692,343, we have described how alkaline earth and perovskite oxides can be grown unstrained and commensurately upon silicon to form a structure series of $(AO)_n(A'BO_3)_m$, in which n and m are non-negative integer repeats of single plane commensurate oxide layers and that this structure can be utilized in the development of a new semiconductor technology. This new technology is distinct from the device technology in common usage which is based upon amorphous $SiO_2$-on-silicon technology because by virtue of its amorphous state, the oxide in the commonly-used technology exhibits no directionality in its properties or its response to applied fields. Consequently, $SiO_2$ is treated as an isotropic material with no crystallographic anisotropy in its response to internally or externally applied electric fields. In contrast, in this new technology, there is a fundamental change to be taken advantage of since there exists "easy" directions in the crystalline oxides that promote polar phenomena and device physics that can utilize these directions in unique device designs and functions. One example of such a device is a ferroelectric field effect transistor in which tetragonal distortion of a ferroelectric oxide is utilized to modulate the channel current in the surface doped semiconductor substrate. It would therefore be desirable to take advantage of the directional-dependent qualities of crystalline oxides when grown in a thin film layup atop a semiconductor-based substrate to enhance the use of such oxides in device technology.

Accordingly, it is an object of the present invention to provide a new and improved crystalline-on-oxide structure wherein the unit cells within the thin film layers of the structure are arranged so that the directional-dependent qualities of substantially all of the unit cells are biased toward a predisposed orientation.

Another object of the present invention is to provide such a structure including a thin film of a perovskite oxide whose unit cells can be advantageously arranged so that the directional-dependent qualities of substantially all of the unit cells are all arranged either substantially in a plane parallel to the surface of the substrate or substantially normal to the surface of the substrate.

Still another object of the present invention is to provide such a structure wherein the orientation of the directional-dependent qualities of substantially all of the unit cells of the thin film material are influenced by the geometric shape of the unit cells.

Yet another object of the present invention is to provide such a structure for use in a device which takes advantage of the anisotropic properties of crystalline oxides and their response to internal and external applied fields.

SUMMARY OF THE INVENTION

This invention resides in a structure including a substrate of semiconductor-based material having a surface and a thin film of anisotropic crystalline oxide epitaxially overlying the substrate surface wherein substantially all of the unit cells of the thin film have a geometry which is arranged in a predisposed orientation relative to the substrate surface and the anisotropic crystalline oxide couples to the underlying semiconductor-based material for use of the semiconductor capabilities of the substrate during a semiconductor application.

In one embodiment of the invention, a directional-dependent quality of each unit cell of the anisotropic oxide (e.g. its dipole moment) is oriented in a plane which is parallel to the substrate surface, and in another embodiment of the invention, a directional-dependent quality of each unit cell of the anisotropic oxide (e.g. its dipole moment) is oriented along lines normal to the substrate surface.

In a further embodiment of the invention, the structure of the invention is embodied in a device for a semiconductor application wherein the coupling between the anisotropic material and the semiconductor-based substrate advantageously effects the behavioral characteristics of the semiconductor-based substrate.

BRIEF DESCRIPTION OF THE DRAWINGS

FIG. 1 is a perspective view of a fragment of one embodiment of a crystalline structure including a silicon substrate and a layup of the perovskite $BaTiO_3$ grown upon the surface of the substrate.

FIG. 2 is a fragmentary cross-sectional view taken about along line 2—2 of FIG. 1.

FIG. 3 is a schematic perspective view of an undeformed unit cell of $BaTiO_3$.

FIG. 4 is a schematic perspective view of the unit cell of FIG. 3 which has been misshapened due to strain.

FIG. 5 is a graph plotting lattice parameters of $BaTiO_3$-including structures as a function of temperature.

DETAILED DESCRIPTION OF THE ILLUSTRATED EMBODIMENTS

Figure 6:
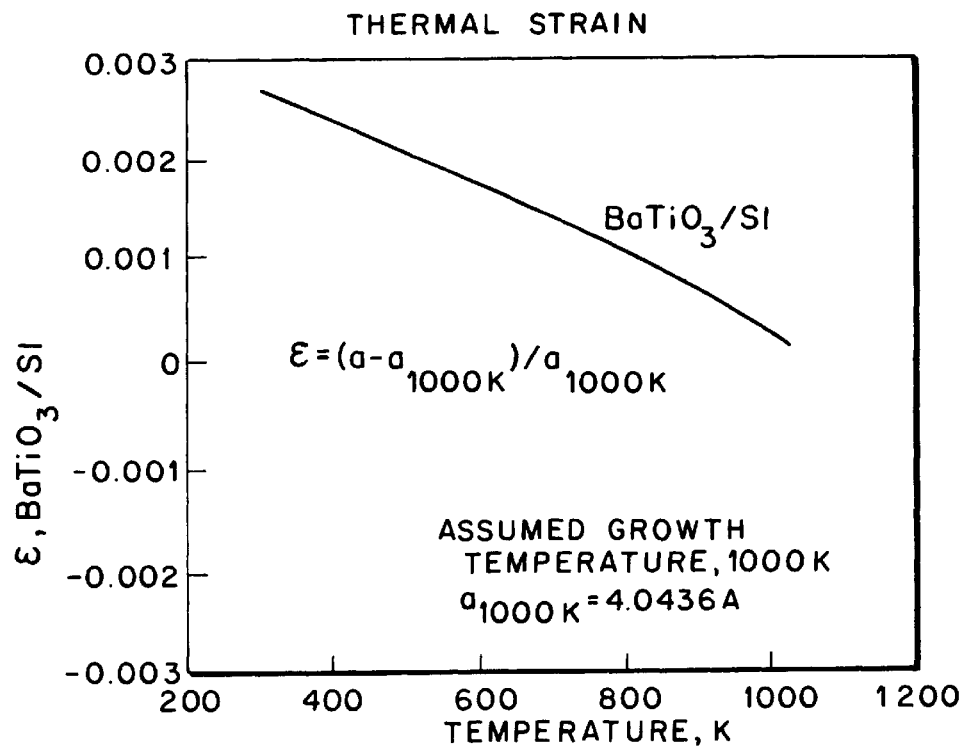
FIG. 6 is a graph plotting thermal strain of $BaTiO_3$ when grown on silicon as a function of temperature.

Turning now to the drawings in greater detail, there is shown in FIGS. 1 and 2 a monolithic crystalline structure, generally indicated 20, comprised of a substrate 22 of silicon and a layup 24 of the perovskite $BaTiO_3$ epitaxially covering the surface of the substrate 22. $BaTiO_3$ is a ferroelectric oxide material which when combined with the silicon substrate 22 in the form of an overlying and epitaxial thin film enables the crystalline structure 20 to take advantage of the semiconductor, as well as the ferroelectric properties, of the structure 20. The structure 20 is a crystalline oxide-on-silicon (COS) structure, but it will be understood that in accordance with the principles of the present invention, a structure can involve a film of crystalline oxide grown upon an alternative semiconductor-based substrate constructed, for example, of silicon-germanium, germanium or other materials in the Group III–V, IV and II–IV classes. Along these lines, the substrate can be comprised of silicon-germanium ($Si_yGe_{1-y}$) wherein the variable "y" could range from 0.0 to 1.0.

The crystalline form of $BaTiO_3$ is anisotropic in that each of its unit cells has a directional-dependent quality, and as will be apparent herein, this directional dependent quality of each unit cell of $BaTiO_3$ in the layup 24 is arranged in a predisposed orientation relative to the substrate surface. For present purposes, the directional-dependent quality of each $BaTiO_3$ unit cell of the exemplary layup 24 is its polar axis or, in other words, its permanent spontaneous electric polarization (i.e. the electric dipole moment). Accordingly, in the exemplary structure 20, it is the dipole moment of substantially every $BaTiO_3$ unit cell which is arranged in a predisposed orientation relative to the substrate surface.

Although the structure 20 is described herein as including an epitaxial film of $BaTiO_3$, a ferroelectric film-including structure in accordance with the broader aspects of this invention does not require commensurate periodicity in order that the directional-dependent qualities (e.g. the dipole moments) of the unit cells of the materials are arranged in a predisposed orientation. Instead, it is the geometric influence (described herein) to which the unit cells are exposed, rather than any commensurate periodicity, that arranges the directional-dependent qualities of the unit cells in a predisposed orientation. Accordingly, the principles of the present invention can be variously applied.

In addition, the composition of the structure 20 is a member of our general series of commensurate structures designated as $(AO)_n(A'BO_3)_m$ (and described in our referenced co-pending U.S. application Ser. No. 08/692,343, filed Aug. 5, 1996) in which n and m are the integer repeats (i.e. non-negative integer repeats) of single plane commensurate oxide layers. If n=1, then the perovskite is grown directly as $ABO_3$ from the silicide truncation of silicon beginning at the AO plane. If n>1, the face-centered NaCl-type structure is grown at the interface then truncated with the $BO_2$ plane to transition with the perovskite structure. Accordingly, the principles of the present invention can be applied to any member of our structures designated as $(AO)_n(A'BO_3)_m$.

An exemplary process whose steps can basically be followed in order to construct the crystalline structure 20 of FIGS. 1 and 2 is set forth our referenced co-pending U.S. application Ser. No. 08/692,343, filed Aug. 5, 1996 and the disclosure of which is incorporated herein by reference, so that a detailed description of the construction process is not believed to be necessary. Briefly however and with reference to FIG. 2, in order to produce a structure having a $BaTiO_3$ film whose lattice structure is in a positively-strained (i.e. an in-plane, tensile-strained) condition atop the silicon substrate and so that a directional-dependent quality, i.e. the dipole moment, of each $BaTiO_3$ unit cell is oriented parallel to, or in the plane of, the thin film, initial steps are taken to cover the surface, indicated 26 of the silicon substrate 22 (or wafer) with a thin alkaline earth oxide film 28 of $Ba_{0.725}Sr_{0.275}O$. An initial step in the deposition of this oxide atop the silicon substrate 22 involves the deposition of a fraction of a monolayer (e.g. one-fourth of a monolayer) of an alkaline earth metal atop the silicon as is described in our U.S. Pat. No. 5,225,031, the disclosure of which is incorporated herein by reference. The $Ba_{0.725}Sr_{0.275}O$ film 28 is thereafter covered with a thin perovskite (template) film 30 of $Ca_{0.64}Sr_{0.36}TiO_3$, and then to cover the film 30 with the desired (multi-stratum) film 32 of $BaTiO_3$ to provide the layup 24 and thus the resultant structure. Each of the alkaline earth oxide film and the template film and at least the first few layers of the $BaTiO_3$ film is constructed in somewhat of a single plane-layer-by-single-plane layup fashion to ensure commensurate periodicity throughout the build-up of the exemplary COS structure 20 and wherein the films are selected for used in the build-up of the structure for the lattice parameters of the unit cells of the films. In other words, to promote thermal strain at the thin film/silicon interface, the thin film materials are selected so the lattice parameters of adjacent films are not equal, but instead are slightly different from one another to promote lattice strain between the adjacent layers.

The differences between the coefficients of thermal expansion (i.e. linear thermal expansion) of the constituents of the structure strongly effect the coupling of the ferroelectric material to the semiconductor substrate in the resultant structure. In other words, the coupling of the unit cells of $BaTiO_3$ to the underlying substrate (in this case, silicon) can advantageously effect the performance of the substrate during use in an electronic application. In this regard, the coefficient of thermal expansion of silicon is smaller than that of $BaTiO_3$ so that a uniform heating (or cooling) of the resultant structure results in a tendency of the $BaTiO_3$ film to misshapen, as will be described herein, and the tendency for an appreciable in-plane strain to develop within the $BaTiO_3$ film.

Applicants have discovered, however, that the relative thermal expansion (or contraction) between silicon and $BaTiO_3$ is of less consequence during the build-up of the film than it is when the film is subsequently cooled during a cool-down period following of the deposition of the $BaTiO_3$ film atop the silicon. In this connection, the steps involving the deposition of $BaTiO_3$ are carried out at a relatively high (growth) temperature of about 600° C., and at this temperature, the deposited film of $BaTiO_3$ is substantially free of in-plane strain. Following this deposition process, however, the resulting structure is subsequently cooled to a lower temperature, such as about 40° C. (closer to room temperature), and it is during this cooling process that the differences in thermal expansion (or contraction) characteristics between the silicon and the $BaTiO_3$ come into play. Phase transformations may or may not occur within the $BaTiO_3$ film during cooling depending upon the extent to which the lattice is constrained during cooling. In other words, by using the techniques described herein to induce lattice strain within the oxide overlayer, phase transformations during cooling of the oxide overlayer can be minimized.

More specifically, as the resultant structure is cooled as aforedescribed, the differences in thermal expansion (or contraction) of the $BaTiO_3$ film and the silicon effects a greater shrinkage of the $BaTiO_3$ film than the silicon. In other words, as the resultant structure is cooled from the deposition temperature of about 600° C., the number of BaTiO$_3$ unit cells per unit area at the Si/BaTiO$_3$ interface remain proportional to the number of Si unit cells per unit area at the Si/BaTiO$_3$ interface while the atoms of the BaTiO$_3$ film tend to move closer together than do the atoms of the silicon substrate. As the BaTiO$_3$ film attempts to contract more than the silicon, it is constrained by the constraint of the film of BaTiO$_3$ at the Si/BaTiO$_3$ interface. Thus, upon reaching the lower temperature, e.g. room temperature, the BaTiO$_3$ film is constrained to a larger in-plane area than it would otherwise if it were not so constrained. Consequently, the contraction of the BaTiO$_3$ film effects a shortening of the out-of-plane lattice parameter of the BaTiO$_3$ film as a path is traced therethrough from the surface of the silicon.

As the lattice parameter tends to reduce in size as a path is traced through the aforementioned transition layers, the lattice of the BaTiO$_3$ film is exposed to an appreciable amount of biaxial tensile strain induced within the plane of the layers of the film, i.e. in a plane generally parallel to the surface of the silicon, as well as along the sides of the lattice, i.e. along a path normal to the surface of the silicon. With reference to FIGS. 3 and 4 wherein a unit cell of BaTiO$_3$ is denoted 42, this induced strain tends to misshape the form of the BaTiO$_3$ unit cell from a cubic form, as depicted in FIG. 3, to the somewhat distorted cubic form (i.e. to a tetragonal form) as depicted in FIG. 4 wherein the lattice form of the FIG. 4 unit cell has a top which possesses an area which is slightly smaller than the area of its base. Along the same lines, the width of the FIG. 4 unit cell 42 as measured across the base thereof is slightly larger than the height thereof as the volume of the unit cell 42 tends to remain relatively constant as its shape is altered.

It will be understood that amorphous oxides (heretofore used in oxide-on-silicon structures) do not behave in the aforedescribed manner. In other words, since amorphous oxides do not possess unit cells whose geometries can be altered in the aforedescribed manner, the anisotropy of the structure of amorphous oxides cannot be effected by geometric influences as is the case with the structure of the instant invention. Furthermore, unlike the thin film layers of the structure of the instant invention which couple to the underlying semiconductor substrate for purposes of advantageously effecting the behavior of the substrate during an electronic application, amorphous oxides do not couple to the underlying substrate. Accordingly, the instant invention is advantageous in this respect.

With reference to FIG. 5, there is shown a plot of the lattice parameter of BaTiO$_3$/Si and bulk BaTiO$_3$ structures as a function of temperature. It can be seen from the FIG. 5 plot that as the lattice parameter of each structure decreases as the structure temperature decreases, but that the lattice parameter of BaTiO$_3$/Si does not increase as much as does the bulk BaTiO$_3$ through this temperature range. Such a phenomena can be explained in that during a cooling of each of the respective structures, the lattice of Si (having a mass which is much greater than the mass of the overlying thin film) does not permit the lattice parameter of BaTiO$_3$ to reduce to the extent permitted during the cooling of bulk BaTiO$_3$.

Along the same lines, there is shown in FIG. 6 a plot of the in-plane thermal strain induced upon a thin film of BaTiO$_3$ grown upon a substrate of silicon versus the temperature of the structure. Generally, the in-plane strain induced within the BaTiO$_3$ film of the BaTiO$_3$/Si structure increases as the temperature falls from a temperature of about 1030° K.

As is the case with a cubic unit cell of an unpoled ferroelectric material, such as the cubic BaTiO$_3$ unit cell 42 schematically illustrated in FIG. 3, there exists an electric dipole moment which may be oriented along any of three (X, Y or Z) coordinate axes. Therefore, when a layup of BaTiO$_3$ material is in an unstrained (or uncompressed) condition within an epitaxial crystalline layup, the dipole moments of the unit cells may be oriented in any of six directions (corresponding with the number of faces in the unit cell). However, the in-plane strain induced within the BaTiO$_3$ unit cells of the layup 24 of the structure 20 and the consequential geometric misshapening of the unit cells of BaTiO$_3$ into the aforedescribed tetragonal form orients the tetragonal axis (i.e. the longer axis) of the cells parallel to the plane of the substrate and thereby prevents the dipole moment in each unit cell from being naturally established in a direction normal to the plane of the substrate surface. Consequently, the in-plane strain induced within the BaTiO$_3$ layup limits the permissible orientations of the dipole moments in the BaTiO$_3$ unit cells of the layup to those orientations which correspond to the X and Y (FIG. 4) coordinate axes so that substantially all of the dipole moments of the BaTiO$_3$ unit cells in the layup 24 are arranged in a plane oriented parallel to the substrate surface 26.

Figure 7:
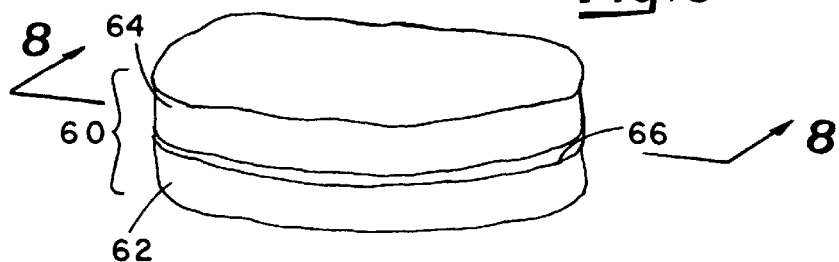
FIG. 7 is a perspective view of a fragment of another embodiment of a crystalline structure including a silicon substrate and a layup of the perovskite $SrTiO_3$ grown upon the surface of the substrate.
Figure 8:
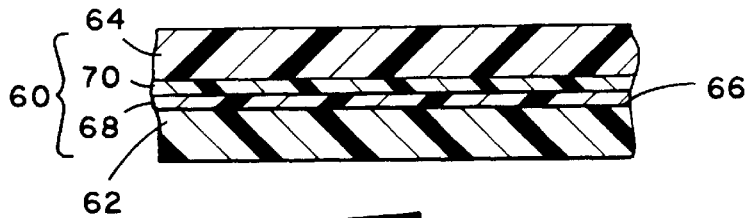
FIG. 8 is a fragmentary cross-sectional view taken about along line 8—8 of FIG. 7.

With reference to FIGS. 7 and 8, there is shown an alternative embodiment of a structure 60 comprising a silicon substrate 62 and a commensurate layup 64 of the perovskite SrTiO$_3$ covering the substrate surface. As is the structure 20 of FIGS. 1 and 2, the structure 60 of FIGS. 7 and 8 is a member of our general series of commensurate structures designated as (AO)$_n$(A'BO$_3$)$_m$ described earlier. However, unlike the structure 20 of FIGS. 1 and 2, the structure 60 of FIGS. 7 and 8 is grown with in-plane compression induced therein, arising entirely from the commensurate, epitaxial strain through the substrate.

A process used to construct the crystalline structure 60 of FIGS. 7 and 8 is comparable to the construction process described above in conjunction with the construction of the FIG. 1 structure 20 except that different elements are used during the construction process. In particular and with reference to FIG. 7, an appreciable portion of the SrTiO$_3$ film 64 is constructed in somewhat of a single plane-layer-by-single plane-layer fashion to ensure commensurate periodicity throughout the build up of the structure 60. In other words, steps are taken to cover the surface, indicated 66, of the silicon substrate 62 with a thin alkaline earth oxide film 68 of one monolayer thickness (following the deposition of a fraction of a monolayer of an alkaline earth oxide metal), then to cover the alkaline earth oxide film 68 with a thin perovskite (template) film 70 of any desired thickness (i.e. one monolayer or greater), and then to cover the perovskite film 70 with the desired (multi-stratum) film 72 of SrTiO$_3$ to provide the layup and thus the resultant structure 60. To maintain the desired periodicity between the SrTiO$_3$ film 72 and the silicon substrate 62 during the growth process, the SrTiO$_3$ unit cells are rotated 45° with respect to the unit cells of the underlying silicon substrate (as the lattice parameter [3.91 angstroms] of SrTiO$_3$ seeks to match the lattice parameter [5.43 angstroms] divided by the square root of 2.0 [or 3.84 angstroms]). If it is desired to magnify the desired negative strain effect upon the lattice of the overlying SrTiO$_3$, various film layers (such as the template film 70) may be omitted or the film layer composition can be altered during the build-up process.

Each of the alkaline earth oxide film 68 and the template film 70 and an appreciable portion of the SrTiO$_3$ film 72 is constructed in somewhat of a single plane-layer-by-single plane-layer fashion to ensure commensurate periodicity throughout the build up of the structure 60 and wherein the layer-construction processes take into account the crystalline form of the material out of which the film is desired to be constructed. Again, for a more detailed description of the construction of the epitaxial film 64 directly atop the surface of the silicon substrate 62, reference can be had to the earlier-referenced co-pending U.S. application Ser. No. 08/692,343. It will be understood, however, that while the referenced application Ser. No. 08/692,343 deals with the build up of commensurate structures in which lattice parameters of adjacent layers match one another so that no strain is induced within the unit cells of the last-constructed oxide layer, materials are selected for the construction of structures in accordance with the present invention whose lattice parameters are different and thereby induce a desired strain (positive or negative) within the unit cells of the last-constructed oxide layer of the structure.

With reference still to the structure 60 of FIGS. 7 and 8, it follows that by virtue of the commensurate periodicity of the thin film 64 of $SrTiO_3$ atop the silicon substrate 62, the atoms of the film 64 are effectively clamped to those of the underlying silicon and the lattice of the film 64 must conform (e.g. contract or expand) in accordance with that of the underlying silicon. As mentioned above, at room temperature, the 3.84 angstrom figure is what the lattice parameter of each unit cell of $SrTiO_3$ seeks to match in the structure 60. Therefore, at room temperature, the $SrTiO_3$ film 64 is strained by about −2% (or, more specifically, compressed by about 2%) from its unstrained (or uncompressed) condition at the silicon/thin film interface, and this induced strain on the $SrTiO_3$ lattice influences the geometry of the $SrTiO_3$ unit cells.

Figure 9:
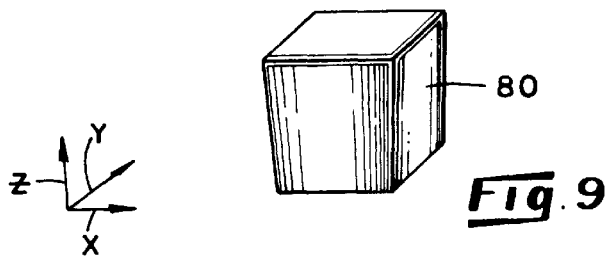
FIG. 9 is a schematic perspective view of a unit cell of $SrTiO_3$ which has been misshapened due to compression.

In particular, the strain which exists at the silicon/film interface exerts an in-plane compression within the $SrTiO_3$ so that the $SrTiO_3$ unit cells are deformed out-of-plane. In other words, as the base of each $SrTiO_3$ unit cell is compressed in-plane, the geometry of the $SrTiO_3$ distorts to a condition (as best illustrated by the $SrTiO_3$ unit cell 80 shown in FIG. 9) wherein the dimensions of the base of the unit cell 80 are smaller than those measured across the top of the cell. Moreover, as the volume of the unit cell 80 is maintained relatively constant as it is deformed, the height of the unit cell increases as the base is compressed. This distortion of the $SrTiO_3$ unit cells into a tetragonal form with the tetragonal axis (i.e. the longer axis) thereof arranged out of the plane of the thin film. Consequently, this strain-induced influence on the geometry of the $SrTiO_3$ unit cells predisposes the tetragonal axis of, and thus the directional-dependent quality of, each unit cell out of the plane of the thin film.

Due to the analogy between $SrTiO_3$ and ferroelectrics in the perovskite series, it follows that ferroelectric oxides can be grown upon a semiconductor-based substrate, such as silicon, so that the directional-dependent qualities, such as the dipole moments, of substantially all of the unit cells of the ferroelectric oxides are oriented out-of-plane relative to the substrate surface. In either event, the thin film materials are selected for the construction process wherein an oxide having a larger lattice parameter is built upon an underlying material having a smaller lattice parameter so that a negative (i.e. compressive) strain is induced within the unit cells of the overlying oxide which geometrically distorts the shape of the unit cells and predisposes the directional-dependent qualities thereof out of the plane of the thin film (i.e. along lines normal to the substrate surface).

It follows from the foregoing that the characteristics of a thin film of crystalline oxide material on Si can be affected when the directional-dependent qualities of the unit cells of the oxide are arranged in a predisposed orientation relative to the substrate surface, and that the predisposed direction of the directional-dependant qualities of the oxide can be controlled through geometric constraint upon the unit cells thereof. In the aforedescribed examples, a strain (i.e. a positive strain in one instance and a negative strain in the other instance) is induced at the silicon/film interface as a consequence of the differences in lattice parameters between the silicon and the crystalline material of the film layup. Thus, by appropriately selecting an anisotropic oxide for growth upon a silicon substrate whose unit cells are placed in either a strained or compressed condition (e.g. within a strained condition of between about ±2%) when cooled to an appropriate temperature below the growth temperature, the directional-dependent qualities of the unit cells will be predisposed along directions oriented in a plane which is parallel to the surface of the silicon substrate or along lines normal to the substrate surface.

Moreover, this invention is particularly advantageous in that the overlying anisotropic material couples to the underlying semiconductor substrate for affecting the electronic capabilities of the substrate. In other words, with the geometry of the unit cells of the anisotropic material constrained so that the directional-dependent qualities of the unit cells are oriented either in a plane which is parallel to the substrate surface or along lines normal to the substrate surface, the coupling of the anisotropic material to the semiconductor substrate enables the substrate to behave in an advantageous and reproducible manner during an electronic application. Therefore, the structure of this invention can be embodied in semiconductor devices which use the coupling of the anisotropic thin film material with the underlying semiconductor material during an electronic application.

Figure 10:
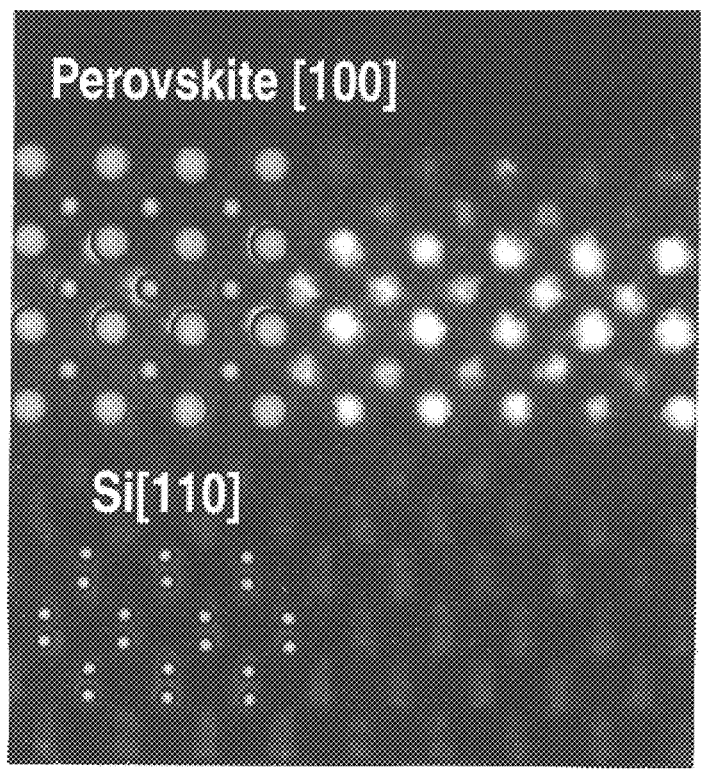
FIG. 10 is a Z-contrast image of $SrTiO_3$ on (100) silicon.

In accordance with the foregoing, we have experimentally established that perovskite oxides can be grown in perfect registry with the (100) face of silicon while totally avoiding the amorphous silica phase that forms when silicon is exposed to an oxygen-containing environment. In particular, a metal-oxide-semiconductor (MOS) capacitor has been constructed using the perovskite $SrTiO_3$ (as an alternative to amorphous $SiO_2$) and wherein its $SrTiO_3$ layer is 150 angstroms in thickness and the underlying silicon is p-type silicon. A Z-contrast image (taken at atomic scale) of a cross section of the constructed capacitor is shown in FIG. 10 illustrating the arrangement of atoms at the oxide/silicon interface. The epitaxy that is apparent from the FIG. 10 image is (100) $SrTiO_3$//(001) Si and $SrTiO_3$[110]//Si[100]. On the left side of the image is an insert model of the perovskite/silicon projection.

Figure 11:
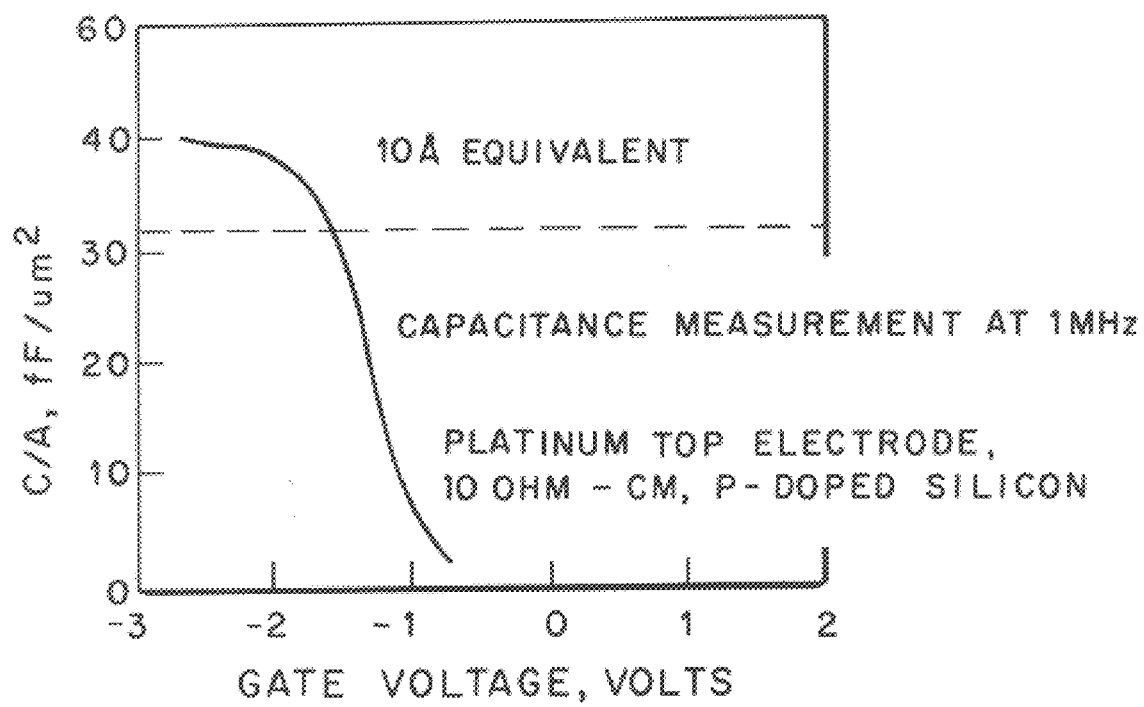
FIG. 11 is a plot of capacitance versus voltage for a $SrTiO_3$ capacitor.

Inasmuch as the perfection of the physical structure of the constructed MOS capacitor couples directly to the electrical structure, we obtain for the constructed capacitor (having the oxide thickness of 150 angstroms) an equivalent oxide thickness of less than 10 angstroms (i.e. about 8.8 angstroms) wherein the equivalent oxide thickness, $t_{eq}$, can be defined for a metal-oxide-semiconductor (MOS) capacitor as:

$$t_{eq} = \epsilon_0 \frac{\epsilon_{SiO_2}}{(C/A)_{ox}} \quad 1)$$

wherein $\epsilon_{SiO_2}$ and $\epsilon_0$ are the dielectric constants of silica and the permitivity of free space, respectively, and $(C/A)_{OX}$ is the specific capacitance of the MOS capacitor. FIG. 11 shows a plot of our data for specific capacitance against voltage for our constructed capacitor. This capacitor exhibits a C/A value of 40 fF/um$^2$ at negative voltages where the field is across the oxide. The interface trap density, obtained from the frequency dependence of the capacitance data, is sharply peaked at 0.11 ev above the valence band with values that range from 10$^{10}$/cm$^2$. An analysis of this data suggests that the interface registry is so perfect that the original silicon surface step interactions can be identified as the interface trap states. The relatively small equivalent oxide thickness for this capacitor is an unparalleled result for MOS capacitors and suggests that crystalline oxides-on-silicon (COS) can potentially replace silica in transistor gate technology.

It will be understood that numerous modifications and substitutions can be had to the aforedescribed embodiments without departing from the spirit of the invention. For example, while much of the foregoing discussion has focused upon the ferroelectric qualities of a perovskite constructed on a semiconductor-based material, it will be understood by one skilled in the art that many comparable structures can be constructed in accordance with the principles of the present invention which possess other desirable characteristics. For example, comparable devices can be constructed which are piezoelectric in nature, pyroelectric in nature or electro-optic in nature. Accordingly, the aforedescribed embodiments are intended for the purpose of illustration and not as limitation.

We claim:

1. A structure comprising:
   a substrate of semiconductor-based material having a surface; and
   a thin film of anisotropic crystalline oxide epitaxially overlying the substrate surface wherein the anisotropic crystalline oxide includes unit cells wherein each unit cell possesses a directional-dependent quality and the thin film is exposed to in-plane strain at the substrate/thin film interface so that substantially every one of the unit cells of the thin film has a geometrical shape which is influenced by the in-plane strain so that the directional-dependent quality is arranged in a predisposed orientation relative to the substrate surface.

2. The structure as defined in claim 1 wherein the directional-dependent quality of each unit cell of the thin film is oriented in either a plane which is parallel to the substrate surface or along lines normal to the substrate surface.

3. The structure as defined in claim 2 wherein the thin film material is in a state of biaxial tension so that the geometric shape of each unit cell of the thin film is characterized by a width as measured in the plane of the thin film which is greater than its height as measured normal to the plane of the thin film and so that the directional-dependent quality of each unit cell is arranged in a plane which is parallel to the substrate surface.

4. The structure as defined in claim 2 wherein the thin film material is in a state of biaxial compression so that the geometric shape of each unit cell of the thin film is characterized by a width as measured in the plane of the thin film which is smaller than its height as measured normal to the plane of the thin film and so that the directional-dependent quality of each unit cell is arranged along a line which is generally normal to the substrate surface.

5. The structure as defined in claim 2 wherein the thin film material is a ferroelectric oxide having unit cells whose dipole moment provides the directional-dependent quality of the unit cells, and the predisposed orientation of the geometries of the unit cells arranges the dipole moments of substantially all of the unit cells in either a plane which is parallel to the substrate surface or along lines normal to the substrate surface.

6. A structure comprising:
   a substrate of semiconductor-based material having a surface;
   a thin film of anisotropic crystalline oxide epitaxially overlying the substrate surface wherein the thin film consists of unit cells of an ABO$_3$ material having at least one AO constituent plane and at least one BO$_2$ constituent plane and wherein the film is arranged upon the surface of the substrate so that a first single plane consisting of a single atomic layer of said AO constituent of the ABO$_3$ material overlies the surface of the substrate and a second single plane consisting of a single atomic layer of said BO$_2$ constituent of the ABO$_3$ material overlies the first single plane of AO and the AO and BO$_2$ constituent planes form unit cells of the ABO$_3$ material wherein each unit cell has a directional-dependent quality, and
   wherein the unit cells of the crystalline oxide thin film are exposed to an in-plane strain which influences the geometry of the unit cells so that the unit cells of the thin film have geometries which are conformed to a tetragonal shape and so that the tetragonal axis of each conformed unit cell is arranged in a predisposed orientation relative to the substrate surface and so that the predisposed orientation of the geometries of the thin film orients the directional-dependent quality of substantially every one of the thin film unit cells in either a plane which is parallel to the substrate surface or along lines normal to the substrate surface.

7. A device for a semiconductor application wherein the semiconductor capabilities of the device are required to be utilized, the device including a structure comprising:
   a substrate of semiconductor-based material having a surface;
   a thin film of anisotropic crystalline material commensurately overlying the substrate surface so as to provide, with the substrate material, a single crystal and coupling to the underlying semiconductor-based material wherein the thin film is comprised of unit cells commensurately arranged upon the substrate surface and substantially all of the unit cells of the thin film have a geometric form of tetragonal shape and each unit cell of the thin film has a tetragonal axis which is arranged along lines normal to the substrate surface so that the polar axes of substantially every one of the unit cells of the thin film are arranged along lines normal to the substrate surface.

8. The structure as defined in claim 6 wherein the unit cells of the thin film material are in a state of biaxial tension so that the geometric shape of each unit cell of the thin film is characterized by a width as measured in the plane of the thin film which is greater than its height as measured normal to the plane of the thin film and so that the directional-dependent quality of each unit cell is arranged in a plane which is parallel to the substrate surface.

9. The structure as defined in claim 6 wherein the unit cells of the thin film material is a state of biaxial compression so that the geometric shape of each unit cell of the thin film is characterized by a width as measured in the plane of the thin film which is smaller than its height as measured normal to the plane of the thin film and so that the directional-dependent quality of each unit cell is arranged along lines which are generally normal to the substrate surface.

10. The structure as defined in claim 6 wherein the thin film material is a ferroelectric oxide having unit cells whose dipole moment provides the directional-dependent quality of the unit cells, and the predisposed orientation of the geometry of the thin film arranges the dipole moments of substantially all of the unit cells in either a plane which is parallel to the substrate surface or along lines normal to the substrate surface.

11. A structure comprising:

a semiconductor substrate having a surface; and a crystalline film overlying the surface of the substrate wherein the film consists of unit cells of an $ABO_3$ material having at least one constituent plane and at least one $BO_2$ constituent plane wherein said $ABO_3$ material is either arranged in a cube-on-cube relationship with the surface of the substrate or has a lattice parameter which closely approximates the quotient of the lattice parameter of the surface of the substrate divided by the square root of 2.0, and the AO and $BO_2$ of the constituent planes provide a bulk single crystal of said $ABO_3$ material comprised of unit cells of the $ABO_3$ material; and the unit cells of the film being arranged upon the surface of the substrate so that a first single plane consisting of a single atomic layer of said AO constituent of the $ABO_3$ material overlies and is commensurate with the surface of the substrate and a second single plane consisting of a single atomic layer of said $BO_2$ constituent of the $ABO_3$ material overlies and is commensurate with the first single plane of AO; and wherein there exists at the lattice interface between the semiconductor substrate and the $ABO_3$ thin film either a compressed or strained condition which conforms the geometry of each unit cell of the $ABO_3$ thin film material into a tetragonal form so that the tetragonal axis of each unit cell of the $ABO_3$ thin film material is oriented in a predetermined orientation relative to the surface of the substrate so that the tetragonal axis of substantially every one of the unit cells of the $ABO_3$ thin film material are oriented in either a plane which is parallel to the substrate surface or normal to the substrate surface.

12. The structure as defined in claim 11 wherein each unit cell of the $ABO_3$ material has a dipole moment, and the predisposed orientation of the geometric form of the unit cells of $ABO_3$ material is effected by the condition at the lattice interface so that substantially all of the dipole moments of the unit cells of the $ABO_3$ thin film material are arranged substantially parallel to the surface of the substrate.

13. The structure as defined in claim 11 wherein each unit cell of the $ABO_3$ material has a dipole moment, and the predisposed orientation of the geometric form of the unit cells of the $ABO_3$ material is effected by the condition at the lattice interface so that substantially all of the dipole moments of the unit cells of the $ABO_3$ thin film material are arranged substantially normal to the surface of the substrate.

14. The structure as defined in claim 11 wherein the semiconductor substrate includes silicon and the thin film includes a perovskite of the $BaTiO_3$ class of perovskites.

15. The structure as defined in claim 11 wherein the amount of compression or strain which exists at the substrate/$ABO_3$ material interface is within about ±2%.

16. A device for a semiconductor application wherein the device includes a structure comprising:

a substrate of semiconductor-based material having a surface;

a thin film of anisotropic crystalline oxide epitaxially overlying the substrate surface and provides, with the substrate material, a single crystal and wherein each unit cell of the thin film has a tetragonal geometric form having a tetragonal axis and the tetragonal axis of substantially every one of the unit cells of the thin film is arranged in a predisposed orientation relative to the substrate surface and so that the anisotropic material couples to the underlying semiconductor-based material for use of the semiconductor capabilities of the substrate during a semiconductor application.

17. The device as defined in claim 16 wherein the semiconductor-based substrate is silicon.

18. The device as defined in claim 16 wherein the semiconductor-based material is silicon and the anisotropic material is ferroelectric oxide in the perovskite series.

19. The device as defined in claim 7, wherein the device is a ferroelectric field effect transistor.

20. The device as defined in claim 7 wherein the semiconductor-based material is silicon, germanium or a silicon-germanium alloy.

21. The device as defined in claim 20 wherein the device is a field effect transistor.

* * * * *